United States Patent
Crocker et al.

(10) Patent No.: US 8,039,812 B1
(45) Date of Patent: Oct. 18, 2011

(54) TEST EQUIPMENT FOR VERIFICATION OF CRYSTAL LINEARITY AT HIGH-FLUX LEVELS

(75) Inventors: Michael Crocker, Endwell, NY (US); Liza Hart, Nichols, NY (US); Eric Johnson, Greene, NY (US); Gerald Kiballa, Owego, NY (US)

(73) Assignee: SureScan Corporation, Endicott, NY (US)

( * ) Notice: Subject to any disclaimer, the term of this patent is extended or adjusted under 35 U.S.C. 154(b) by 17 days.

(21) Appl. No.: 12/758,964

(22) Filed: Apr. 13, 2010

(51) Int. Cl.
*G01T 1/24* (2006.01)

(52) U.S. Cl. .................................. 250/370.15

(58) Field of Classification Search ............ 250/370.01–370.15, 363.01–363.1; 378/98.8
See application file for complete search history.

(56) References Cited

U.S. PATENT DOCUMENTS

| | | | | |
|---|---|---|---|---|
| 3,814,964 A * | 6/1974 | Ace | ................................. | 313/39 |
| 5,485,005 A * | 1/1996 | Aikens | .................... | 250/214 VT |
| 5,551,244 A * | 9/1996 | Bailey | ............................ | 62/51.2 |
| 5,771,271 A * | 6/1998 | Iodice | .............................. | 378/96 |
| 6,005,911 A * | 12/1999 | Cheung | ............................ | 378/37 |
| 6,249,563 B1 | 6/2001 | Snyder et al. | | |
| 6,370,881 B1 | 4/2002 | Maydanich | | |
| 6,459,757 B1 | 10/2002 | Lacey | | |
| 6,931,092 B2 | 8/2005 | Joshi et al. | | |
| 7,135,687 B2 | 11/2006 | Lacey et al. | | |
| 7,161,157 B2 | 1/2007 | Lacey | | |
| 7,313,921 B2 * | 1/2008 | Milke-Rojo et al. | ............. | 62/3.7 |
| 7,582,879 B2 * | 9/2009 | Abenaim et al. | ......... | 250/370.11 |
| 7,626,193 B2 * | 12/2009 | Itzler et al. | ................. | 250/336.1 |
| 7,705,319 B2 * | 4/2010 | Bale et al. | ................ | 250/370.13 |
| 2003/0136914 A1 * | 7/2003 | Shoji | .......................... | 250/370.1 |
| 2005/0117698 A1 * | 6/2005 | Lacey et al. | ..................... | 378/19 |
| 2009/0185190 A1 * | 7/2009 | Weinberger et al. | .......... | 356/450 |

* cited by examiner

*Primary Examiner* — David P. Porta
*Assistant Examiner* — Kiho Kim
(74) *Attorney, Agent, or Firm* — Mark Levy; Hinman, Howard & Kattell

(57) ABSTRACT

A method and device that provides independent temperature control of x-ray detector crystals, either singly or in small groups. In addition to a thermal control network for the crystals, electronic devices are associated with each detector crystal and are independently cooled using Peltier devices so that lifetime and reliability are maximized. In most operating environments the ambient temperature is less than the operating temperature of the detector crystals. In these situations, the heat removed from the electronics can be used to heat the detector crystals, resulting in efficient operation.

20 Claims, 3 Drawing Sheets

TEST EQUIPMENT FOR VERIFICATION OF CRYSTAL LINEARITY AT HIGH-FLUX LEVELS

FIELD OF THE INVENTION

The present invention relates to x-ray detector crystals and, more particularly, to a method and device that provides independent temperature control of x-ray detector crystals, either singly or in small groups.

BACKGROUND OF THE INVENTION

It is well-known that temperature has a significant effect on the performance of pixilated semiconductor and semi-insulator materials used for photon counting in CT machines. In particular, CdTe, CdTe:Cl, CdZnTe, $HgI_2$, and other semi-insulators exhibit poor carrier transport properties so that significant space charge can build within the material during use. This space charge affects the induced signal, resulting in tailing of the spectrum (i.e., spreading of the lower energy tail), spectral broadening, as characterized by FWHM measurements, and spectral shifts. The counter can become highly non-linear and, in extreme cases, even cease to function.

At low flux, space charge has very little effect. In certain medical applications a higher flux is used so that exposure time can be minimized. Inspection applications, for example in luggage scanning, require a high flux so that penetration can be maximized. In both cases sufficient photons must be collected to ensure statistical significance; it is inevitable that some level of space charge will build up during use.

The energy-discriminating systems currently being developed for medical and inspection applications use spectral integration to determine attenuation over specific energy ranges. Repeatable, non-linear effects can be removed mathematically from the data, provided that the response of the detector crystal does not vary with time. Controlling the temporal variation of space charge is thus critical to advance this technology.

The existing prior art, which deals mostly with scintillator/silicon devices, teaches that the temperature of detector material must be maintained within a narrow range to prevent significant changes in spectral response. Thermo-mechanical stability has also been identified as an important factor in CT applications.

U.S. Pat. No. 6,249,563 for X-RAY DETECTOR ARRAY MAINTAINED IN ISOTHERMAL CONDITION by Snyder et al. teaches the use of heat pipes to reduce temperature gradients within the detector arm of a CT scanner. Related U.S. Pat. No. 6,459,757 for X-RAY DETECTOR ARRAY WITH PHASE CHANGE MATERIAL HEAT SYSTEM by Joseph Lacey teaches the use of a phase change material and a sensor to measure and control the temperature within a detector array. However, this reference fails to control the temperature through the use of a feedback network.

U.S. Pat. No. 6,370,881 for X-RAY IMAGER COOLING DEVICE by Fyodor Maydanich teaches the use of a planar heat spreader disposed directly beneath an array of silicon detectors to maintain a nearly uniform temperature. The heat spreader is cooled with a thermoelectric device.

U.S. Pat. No. 6,931,092 for SYSTEM AND METHOD FOR THERMAL MANAGEMENT OF CT DETECTOR CIRCUITRY by Joshi et al. teaches the use of a heat sink to cool chips used for data acquisition within a CT machine. However, these chips are not located near the scintillator array and are more akin to the cooling schemes that are widely used in computers.

U.S. Pat. No. 7,135,687 for THERMOELECTRICALLY CONTROLLED X-RAY DETECTOR ARRAY STATEMENT REGARDING FEDERALLY SPONSORED RESEARCH by Lacey et al. teaches the use of a thermoelectric system to control the temperature gradient across a large array of detectors. It cannot, however, adequately control a large array of detectors which will be subjected to very different thermal environments due to local conduction and convection effects. It also fails to address the need to reduce space charge at high flux levels, but seeks only to minimize spectral and special shifts with operating temperature.

Finally, U.S. Pat. No. 7,161,157 for SELF REGULATING DETECTOR RAIL HEATER FOR COMPUTED TOMOGRAPHY IMAGING SYSTEMS by Joseph Lacey teaches the use of PTC (Positive Temperature Coefficient) heaters within a detector array to maintain a uniform temperature. Since the current flowing through the heaters is a strong function of temperature, the devices become self-regulating. There is, however, a dependence on ambient temperature, air-flow and other variables. This scheme is therefore unlikely to provide the temperature stability needed to control variations in crystal response arising from the build-up of space charge.

In energy-discriminating CT systems, the performance of pixilated semiconductor and semi-insulator materials is improved when the temperature is raised above 40° C. due to increased carrier mobility.

None of the aforementioned inventions recognizes that detector crystals should be operated at these temperatures. The prior art is largely confined to scintillator/silicon technology; operating temperatures above 35° C. are not taught. Thus the electronics, which are typically reliable only at operating temperatures of less than 40° C., can operate in the same thermal environment as the detectors. This is no longer the case when crystal temperatures are increased to improve carrier mobility.

Further, a complication arises when the counting electronics must be located in proximity to the detector crystal. This requirement arises due to induced noise, low signal levels, and capacitance in the circuitry. It is the proximity of devices, with their conflicting thermal requirements, that has not previously been addressed.

Thus, it is desirable to provide independent means of controlling the temperature of semi-insulator, solid-state detector crystals within a narrow range while cooling their associated electronics so that performance, reliability and lifetime are maximized. Clearly a thermal solution is needed, such as this invention which can control and maintain an elevated temperature in detector crystals, either individually or in small groups, while cooling the associated electronics.

SUMMARY OF THE INVENTION

A method and device provide independent temperature control of x-ray detector crystals, either singly or in small groups. The device includes an insulated chamber with a circulating air stream that encloses the detector crystals, while an air-moving device provides circulation, a heat sink transfers heat into or out of the air stream, a thermoelectric device transfers heat into or out of the heat sink, a housing provides a thermal sink or source for the thermoelectric device, a temperature sensing means either within the air stream or in contact with the detector crystals, and a control network to adjust the temperature according to the temperature sensing means and a predetermined set-point.

Leakage current, which creates noise in the detector network, is not critically important in this application because spectral integration reduces its impact. As a result crystals can be operated at temperatures much higher than currently practiced or rated and, for a given photon flux, the space charge is reduced.

Peltier devices are used to cool or heat crystals, depending on ambient conditions. The temperature is controlled by a feedback network that can be implemented using either analog or digital control. In a preferred embodiment a digital pass-band is used as the control network.

In a preferred embodiment air is directly impinged on the detector crystal in a closed-loop circulation system. Heat removed from the air stream when cooling the crystals is transferred to the outer housing by the Peltier devices. Heat is transferred from the outer housing by the same Peltier devices as the temperature of the crystals is raised. Any crystal or group of crystals can be heated or cooled to the degree necessary to ensure that a uniform temperature, preferably in excess of 40° C., is maintained across the array.

In addition to the thermal control network for the crystals, the electronic devices associated with each detector crystal are independently cooled using a second set of Peltier devices so that lifetime and reliability are maximized. These Peltier devices pump heat from the electronics into the outer housing. In most operating environments the ambient temperature is less than the operating temperature of the detector crystals, so heat removed from the electronics can be used to heat the detector crystals, resulting in efficient operation.

BRIEF DESCRIPTION OF THE DRAWINGS

A complete understanding of the present invention may be obtained by reference to the accompanying drawings, when considered in conjunction with the subsequent, detailed description, in which.

DETAILED DESCRIPTION OF THE PREFERRED EMBODIMENT

The present invention is described with reference to the accompanying FIGS. 1 through 5, where like reference numbers correspond to like elements.

Figure 1:
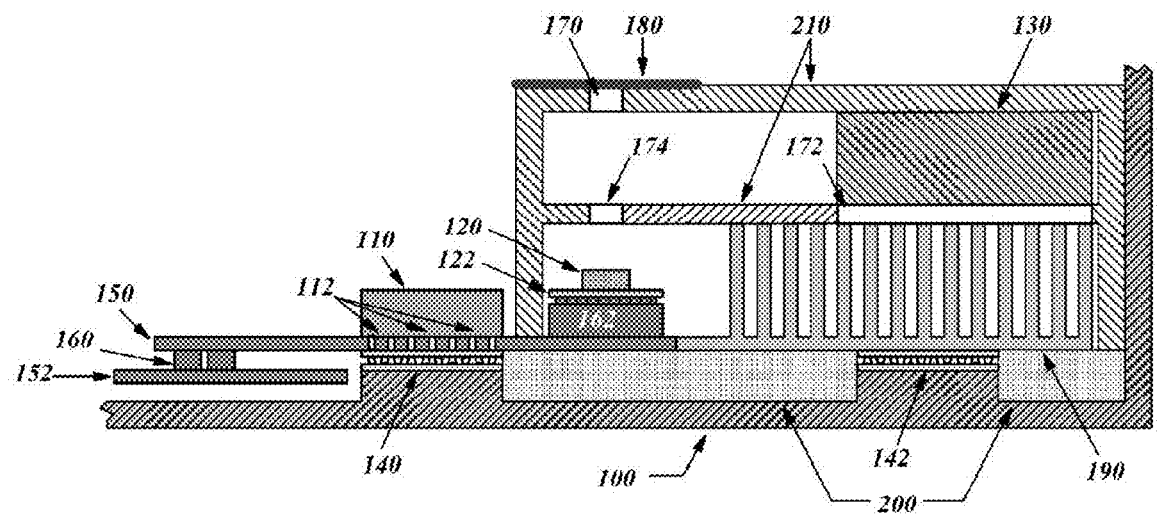
FIG. 1 is a sectional view of a first embodiment of the invention, showing the separate thermal environments of the x-ray crystal and the photon counting electronics; airflow is in the viewing plane.
Figure 2:
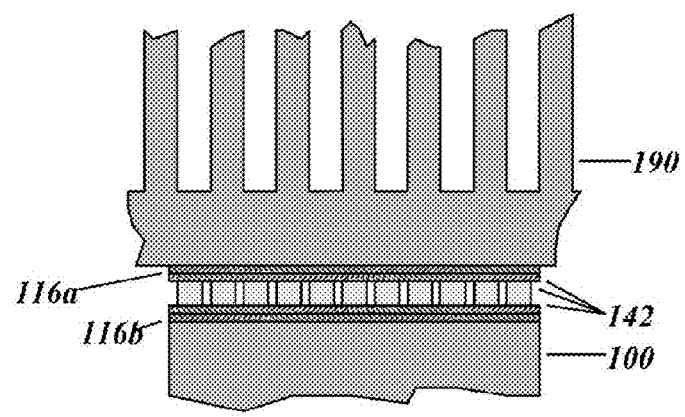
FIG. 2 is a detailed view of the heat sink and first set of Peltier devices used to control the temperature of the x-ray detector crystals.
Figure 3:
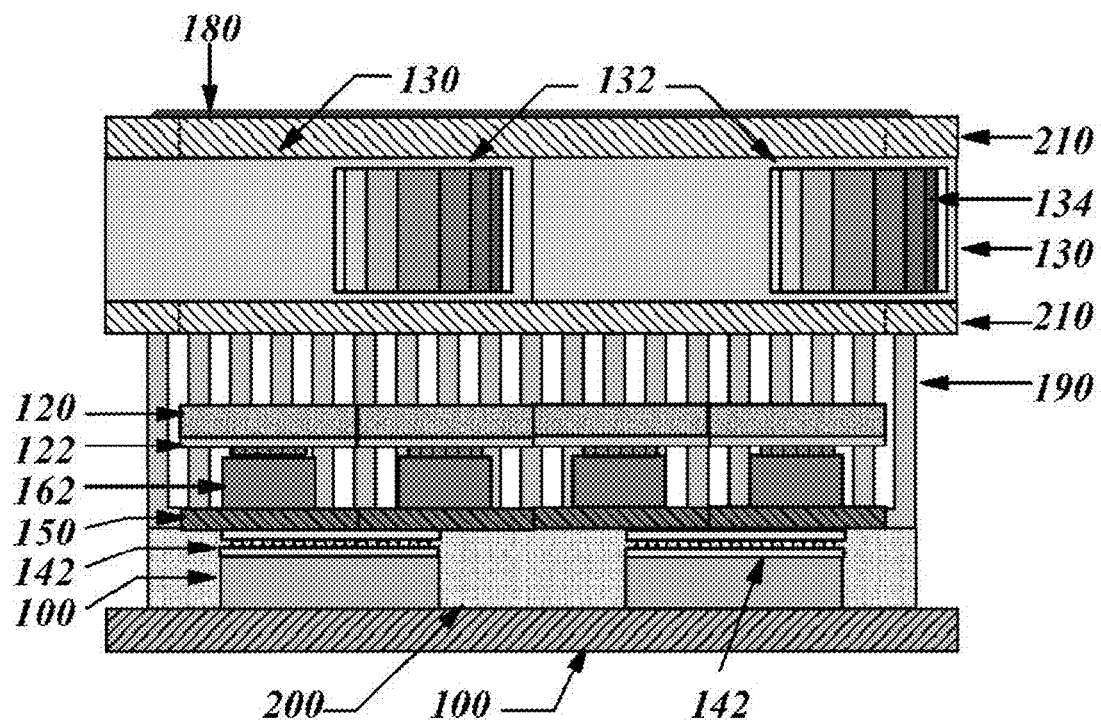
FIG. 3 is a sectional view of the first embodiment of the invention, taken perpendicular to the view in FIG. 1, with the direction of airflow substantially normal to the viewing plane.

FIGS. 1 through 4 are partial drawings of an x-ray detector assembly. In FIGS. 1 and 3, only a portion of the outer enclosure 210 is shown for clarity. It is understood that additional electronics, well known to those versed in the art, have been omitted from the drawings for clarity.

FIG. 1 is a cross-sectional view of the invention. Air-flow is substantially two-dimensional and in the cutting plane used to produce this view. The temperature of the package housing the photon counting electronics 110 is cooled while the detector crystals 120 are maintained within a narrow range of temperatures. In one embodiment the temperature of crystals 120 is controlled to within ±2° C. However, tighter control, to within ±0.5° C., is desirable.

The detector crystals 120 are isolated within insulating enclosure 210. In a preferred embodiment this enclosure 210 is completely contained within a housing 100. However, in another embodiment, enclosure 210 is only partially located within housing 100. Air is circulated within enclosure 210 by a fan or other air-moving device 130 (FIG. 3). The temperature of the air is monitored by an RTD or thermocouple (not shown) that is part of the control network described in detail below.

The flow of heat is described with reference to FIG. 2. When the temperature of the circulating air is below the target temperature, a voltage is applied to the first set of Peltier devices 142 in order to transfer heat from housing 100 to the air stream. Peltier device 142 is a widely-used, solid state device that transfers heat when a voltage is applied across it. In general, the amount of heat that can be pumped is a function of the temperature differential across the device, the applied current, and the temperature of the sink.

Peltier device 142 is disposed between two layers of a thermally-conductive compound 116a and 116b that serve to reduce the thermal resistance. An example of such material 116a, 116b is TIC-1000, manufactured by The Bergquist Company of Chanhassen, Minn. When voltage is applied across Peltier device 142, heat flows from housing 100 through thermally-conductive layer 116b, Peltier device 142, and layer 116a, to a heat sink 190. Peltier device 142 can be smaller than the base of heat sink 190, which acts as a heat-spreader. Any number of Peltier devices 142 can be used with a single heat sink 190. Although heat sink 190 is shown with a pin-finned design, an extruded, finned heat sink 190 can also be used.

Heat removed from housing 100 reduces its temperature below the ambient conditions. It is understood that the reduction in temperature is limited by heat transfer from the environment by free or forced convection via means well known in the art.

Referring once again to FIG. 1, the flow of air within enclosure 210, while heating, is now described in detail. The temperature of heat sink 190 is raised as described directly above. Air-moving device 130, shown as a scroll fan, draws air through heat sink 190, raising the air's temperature. Heated air moves vertically through an opening 172 in the lower portion of enclosure 210, into the intake on the lower surface of fan 130, and is exhausted horizontally into the upper chamber defined by enclosure 210. The air then flows through aperture 174 and impinges on detector crystal 120 before being drawn again through heat sink 190. Aperture 174 constricts the air-flow so that pressure is nearly equal along its length, ensuring that air impinges equally on all crystals 120. Aperture 170 is provided so that an x-ray fan (not shown) can irradiate the crystals 120. Aperture 170 is sealed with, for example, a polyimide tape 180 to prevent the escape of air from enclosure 210.

FIG. 3 provides another view of a portion of the circulation path. At first, air drawn through heat sink 190 flows horizontally in order to gain heat, and then flows vertically through openings (not visible) in enclosure 210, into scroll fans 130.

Impellers 134 force air through openings 132 in the fan housings, and from there through the remainder of the circulation path.

Since it is an object of this invention to operate the detector crystals 120 at temperatures above 40° C., it is necessary to provide heating to the detector crystals 120 in most settings. It may, however, be necessary to cool the crystals 120 if the x-ray detector is operated at extremely high ambient conditions. In such instances the airflow is identical to that described above and the voltage applied to the Peltier devices 142 is reversed so that heat is removed from the air stream.

Figure 4:
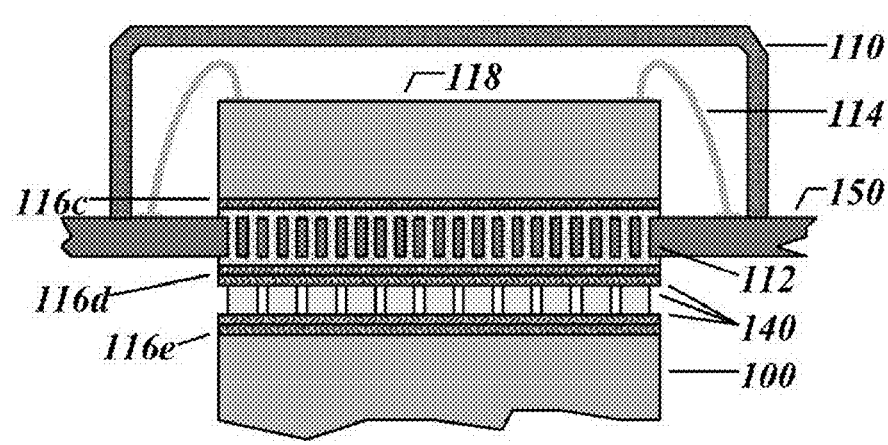
FIG. 4 is a detailed view of counting electronics and a second set of Peltier devices, showing the cooling path for the electronics.

The cooling path for the electronic device package 110 is now described with reference to FIG. 4. Reliability of electronic components is understood to be a direct function of operating temperature. Thus, heating of device 110 is not required. The electronics typically comprise an Application Specific Integrated Circuit ASIC) 118 that is back-bonded to a circuit card 150, using a thermally-conductive material 116c, such as that previously described. Wire-bonds 114 are used to make the electrical connections to circuitry (not shown) on card 150. An alternative structure uses flip-chip interconnections. All such processes are widely practiced.

Heat is generated on the active surface of ASIC 118 and is conducted through the semiconductor material, the conductive layer 116c, and through card 150 by thermal vias 112. Another layer of thermally-conductive compound 116d conducts heat into the upper layer of Peltier device, 142. When cooling, heat is pumped across Peltier device 142 from the second thermally-conductive layer 116d to a third, similar material 116e. Finally, the enclosure 100 acts as a heat sink, absorbing the thermal energy transported by Peltier device 142.

Referring again to FIG. 1, the operation of the system is described. In most instances the ambient temperature surrounding enclosure 100 is at a temperature below the operating point of the crystals 120. In such cases, heat pumped from the electronics package 110 by Peltier devices 142 will supply the source for heat pumped to the air-stream by Peltier devices 142. Such a thermal circuit is extremely efficient. In a particular embodiment of the invention, a set of eight CZT crystals, supplied by eV Products of Saxonburg, Pa., were combined within a single housing. Eight proprietary ASICs were used to read the signal from each of the detector crystals, dissipating a total of 2 W. Two Peltier devices produced by Ferrotec USA Corp. of Bedford, N.H., were attached to a heat sink as described in a preferred embodiment above.

At an ambient temperature of 25° C. the target temperatures for the ASICs and the detector crystals were respectively set at 32° and 42° C. The ASIC temperature remained below 32° C. at all times. The detector crystals reached the target temperature within eight minutes and subsequently remained within the target range of ±0.2° C. The temperature of the enclosure was found to average about 0.7° C. above the ambient temperature under free-convection conditions.

Figure 5:
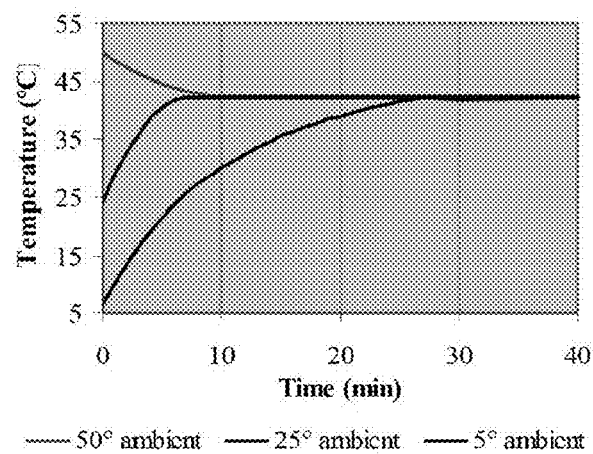
FIG. 5 is a graph that depicts the temperature as a function of time for the detector crystal under different ambient conditions.

Target temperatures were also maintained within ±0.2° C. at an ambient temperature of 50° C. In this instance, heat was transferred from both the electronics 110 and the detector crystals 120 to the enclosure 100. This resulted in a slightly greater difference in temperature between the enclosure 100 and the ambient temperature—about 0.9° C. in this instance. A plot of crystal temperature vs. time at ambient temperatures of 5°, 25° and 50° C. is shown in FIG. 5.

The operation of an exemplary temperature control network is now explained with reference to FIGS. 2 and 6. Many alternate control schemes are possible and can be practiced within the art. While the operation described relates to the detector crystals, it is understood that the network controlling the temperature of the ASICs operates similarly.

Figure 6:
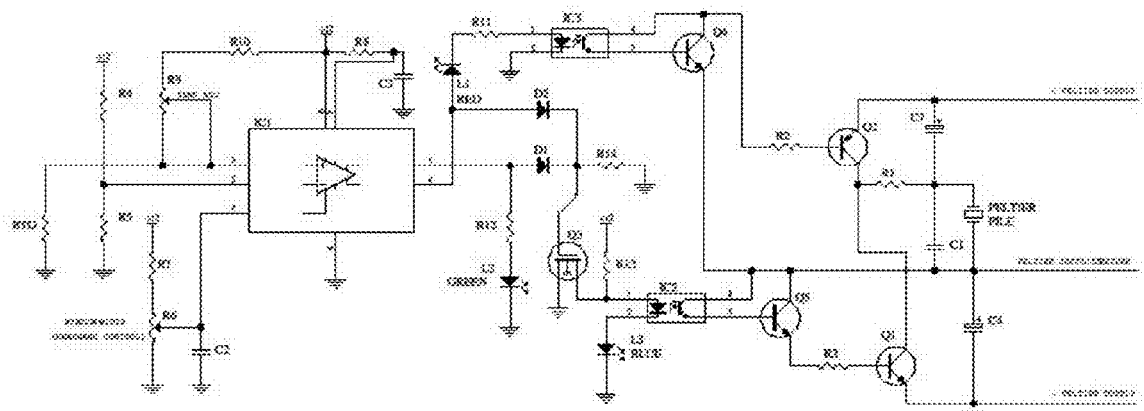
FIG. 6 is a schematic representation of a digital control network.

Three groups of components are shown in the electrical schematic diagram of FIG. 6. The first group comprises the temperature comparator (IC1) and its related components above it and to the left. The second group comprises a set of LEDs used to monitor operation, and an AND-gate with opto-isolator outputs. The third group comprises the Peltier driver circuit driven by opto-isolators.

The comparator has three inputs: V+, V− and a temperature window voltage Vw. This window defines a deadband whose width is adjusted by R6. The negative input, V−, is used as the reference and controls the center value of the temperature window. When at a given temperature the RDT resistance is equal to the series resistance of R10 and R9 the voltage at pin 2 of IC1 is in the center of the window. The output of IC1 at pin 1 goes high. This lights the green LED, indicating an "at temperature state." As the temperature at the RDT drops, the input voltage at pin 3, V3, increases. When the resultant volt-age surpasses the upper limit of the temperature window, V3>V++[Vw/2], the output at pin 6 is driven high. This lights the red LED and extinguishes the green LED, indicating that the temperature is no longer in the window and a heat cycle is in progress.

The current that lights the red LED also drives the opto-isolator 103, which in turn supplies the bias to turn on Q2, supplying a positive current to the Peltier devices 142. This positive current increases the temperature of heat sink 190, which in turn raises the temperature of the air-stream, the RDT, and the detector crystals 120. As the temperature at the RDT increases in response to the heating cycle, the voltage at pin 3 of IC1 decreases until it again falls within the deadband, turning off the bias to the driver transistor Q2 and removing the current from the Peltier devices 142.

In the event the RDT temperature exceeds the deadband, the voltage at pin 3 drops so that V3<V+−[Vw/2] and the output at pin 6 of IC1 is driven low. Since neither D2 nor D1 are forward biased, no voltage is developed at R14 to turn on Q3. As a result, the blue LED and opto-isolator IC2 turn on, supplying bias to Q1, supplying a negative current to the Peltier devices 142. This negative current then cools heat sink 190, cooling the air-stream, the RDT, and the detector crystals 120. As the RDT senses the decrease in temperature, the voltage at pin 3 of IC1 increases until the voltage is once again within the deadband, driving pin 1 of IC1 high, lighting the green LED, forward biasing D1, so that the voltage across R14 in turn shunts IC2's LED and the blue LED L3. This removes the bias on Q1 and the negative current from the Peletier devices 142.

Since other combinations, modifications and changes varied to fit particular operating requirements and environments will be apparent to those skilled in the art, the invention is not considered limited to the chosen preferred embodiments for purposes of this disclosure, but covers all changes and modifications which do not constitute departures from the true spirit and scope of this invention.

Having thus described the invention, what is desired to be protected by Letters Patent is presented in the subsequently appended claims.

What is claimed is:

1. A structure for controlling the temperature of at least one solid-state detector crystal in a photon-counting system comprising:
   an insulated chamber enclosing a detector crystal;
   a circulating air-stream within said chamber;
   an air-moving device disposed in said chamber to provide air circulation;

a heat sink to transfer heat into or out of said air-stream;

a thermoelectric device to transfer heat into or out of said heat sink;

a housing to provide a thermal sink or source for said thermoelectric device;

temperature sensing means within said air-stream or connected to said detector crystal; and a control network to adjust the temperature according to said temperature sensing means and a predetermined set point.

2. The structure of claim 1, wherein said crystal is maintained at a temperature of at least 40° C. so that carrier mobility is increased.

3. The structure of claim 1, wherein said crystal is maintained at a temperature of at least 45° C.

4. The structure of claim 1, wherein said circulating airstream impinges directly on said detector crystal.

5. The structure of claim 1, wherein said insulating chamber separates said detector crystal from any associated electronic devices.

6. A structure for independently controlling the temperature of at least one solid-state detector crystal and at least one package of associated electronic devices, wherein said electronic devices are in proximity to said detector crystals, comprising:

cooling means for at least one electronic device;

temperature control means for at least one detector crystal;

a plurality of detector crystals;

electronic devices; and an enclosure to thermally isolate said detector crystals from said electronic devices.

7. The structure of claim 6, wherein said cooling means for said electronics and said temperature control means for said detector crystals are directly linked by a thermal conduction path.

8. The structure of claim 7, wherein said thermal conduction path receives heat rejected from said cooling means for said electronics and supplies heat for said temperature control means when heating said crystals.

9. The structure of claim 7, wherein said thermal conduction path receives heat rejected from said cooling means for said electronics and heat rejected by said temperature control means when cooling said crystals.

10. The structure of claim 7, wherein said at least one of said electronic devices is maintained at a temperature less than 35° C.

11. The structure of claim 6, wherein at least one of said detector crystals is maintained at a temperature of at least 40° C. while at least one of said electronic devices is maintained at a lower temperature.

12. The structure of claim 6, wherein said at least one of said detector crystals is maintained at a temperature of at least 45° C. while said at least one of said electronic devices is maintained at a temperature lower than 45° C.

13. The structure of claim 12, wherein said at least one of said electronic devices is maintained at a temperature less than 35° C.

14. The structure of claim 6, wherein said cooling means for said at least one of said electronic devices is a thermoelectric device.

15. The structure of claim 6, wherein said cooling means for said at least one of said electronic devices has a direct conduction path thereto.

16. The structure of claim 6, wherein said temperature control means for said detector crystals comprises a circulating stream of air.

17. The structure of claim 16, further comprising a thermoelectric device to transfer heat to or from said circulating stream of air.

18. The structure of claim 6, wherein said temperature control means is an analog feedback network.

19. The structure of claim 18, wherein said analog feedback network regulates current by dissipation, sinking waste heat into said housing of said structure.

20. The structure of claim 6, wherein said temperature control means is a digital feedback network.

* * * * *